(12) United States Patent
Gregerson et al.

(10) Patent No.: US 7,694,254 B2
(45) Date of Patent: Apr. 6, 2010

(54) METHOD, COMPUTER PROGRAM PRODUCT, AND APPARATUS FOR STATIC TIMING WITH RUN-TIME REDUCTION

(75) Inventors: James C. Gregerson, Hyde Park, NY (US); Kerim Kalafala, Rhinebeck, NY (US); Alexander Suess, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 536 days.

(21) Appl. No.: 11/619,349

(22) Filed: Jan. 3, 2007

(65) Prior Publication Data

US 2008/0163147 A1 Jul. 3, 2008

(51) Int. Cl.
*G06F 17/50* (2006.01)
(52) U.S. Cl. .................... 716/6; 716/4; 716/5
(58) Field of Classification Search ............ 716/4, 716/5, 6
See application file for complete search history.

(56) References Cited

U.S. PATENT DOCUMENTS

| | | | |
|---|---|---|---|
| 5,365,463 A * | 11/1994 | Donath et al. ............ 703/19 |
| 5,557,531 A * | 9/1996 | Rostoker et al. .......... 716/1 |
| 6,205,572 B1 | 3/2001 | Dupenloup | |
| 6,507,938 B1 * | 1/2003 | Roy-Neogi et al. ...... 716/10 |
| 6,615,395 B1 | 9/2003 | Hathaway et al. | |
| 6,766,504 B1 | 7/2004 | Rahut et al. | |

OTHER PUBLICATIONS

Zhang et al., "Statistical Timing Analysis with Extended Pseudo-Canonical Timing Model", Proceedings of the Design, Automation and Test In Europe Conference and Exhibition (Date '05), 2530-1591/05 IEEE.
Grant et al., "The Benefits and Costs of DyC's Run-Time Optimizations", ACM Transactions on Programming Languages and Systems, vol. 22, No. 5, Sep. 2000, pp. 932-1072.

* cited by examiner

*Primary Examiner*—Sun J Lin
(74) *Attorney, Agent, or Firm*—Cantor Colburn LLP; William Kinnaman, Jr.

(57) ABSTRACT

Run-time reduction is achieved in timing performance of a logical design, such as a digital integrated circuit. A portion of the logical design that is expected to be stable with respect to timing performance, such as a clock tree, is identified. Timing sensitivities, including sensitivities to sources of variability, of the identified portion of the logical design are determined at a given instant. The timing sensitivities of the identified portion of the logical design are saved for re-use. The saved timing sensitivities are re-used throughout the timing analysis and in subsequent timing analyses.

20 Claims, 3 Drawing Sheets

METHOD, COMPUTER PROGRAM PRODUCT, AND APPARATUS FOR STATIC TIMING WITH RUN-TIME REDUCTION

BACKGROUND

This invention relates generally to timing, in particular to reducing run-time in timing analysis.

Integrated circuits comprise many interconnects for connecting blocks of circuitry. As the size of integrated circuits continues to shrink, the number of sources of variation which need to be modeled in order to accurately represent timing behavior has greatly increased. This, in turn, has led to an explosive increase in modeling run-time for integrated circuits.

The tool development community has responded by removing un-needed calculations within a timing run, increasing the use of caching, etc. However, even these efforts have fallen short of reducing run-time to a satisfactory level. Some chips take many days to complete timing analysis on the fastest machines available. This extended analysis time has already delayed the release of some designs into the foundry.

There is thus a need for an improved timing technique with reduced run-time.

SUMMARY

According to exemplary embodiments, a method, computer program product, and apparatus are provided for timing performance of a logical design, such as a digital integrated circuit. At least one portion of the logical design that is expected to be stable with respect to timing performance is identified, such as a clock tree. Timing sensitivities of the identified portion of the logical design are determined at a given instant. The timing sensitivities of the identified portion of the logical design are saved for re-use in a timing analysis. The saved timing sensitivities of the identified portions of the logical design are re-used throughout the timing analysis and in subsequent timing analyses.

BRIEF DESCRIPTION OF THE DRAWINGS

These features and advantages of exemplary embodiments will be become further apparent to those skilled in the art from the following detailed description taken in conjunction with the accompanying drawings wherein.

DETAILED DESCRIPTION OF EXEMPLARY EMBODIMENTS

Figure 1:
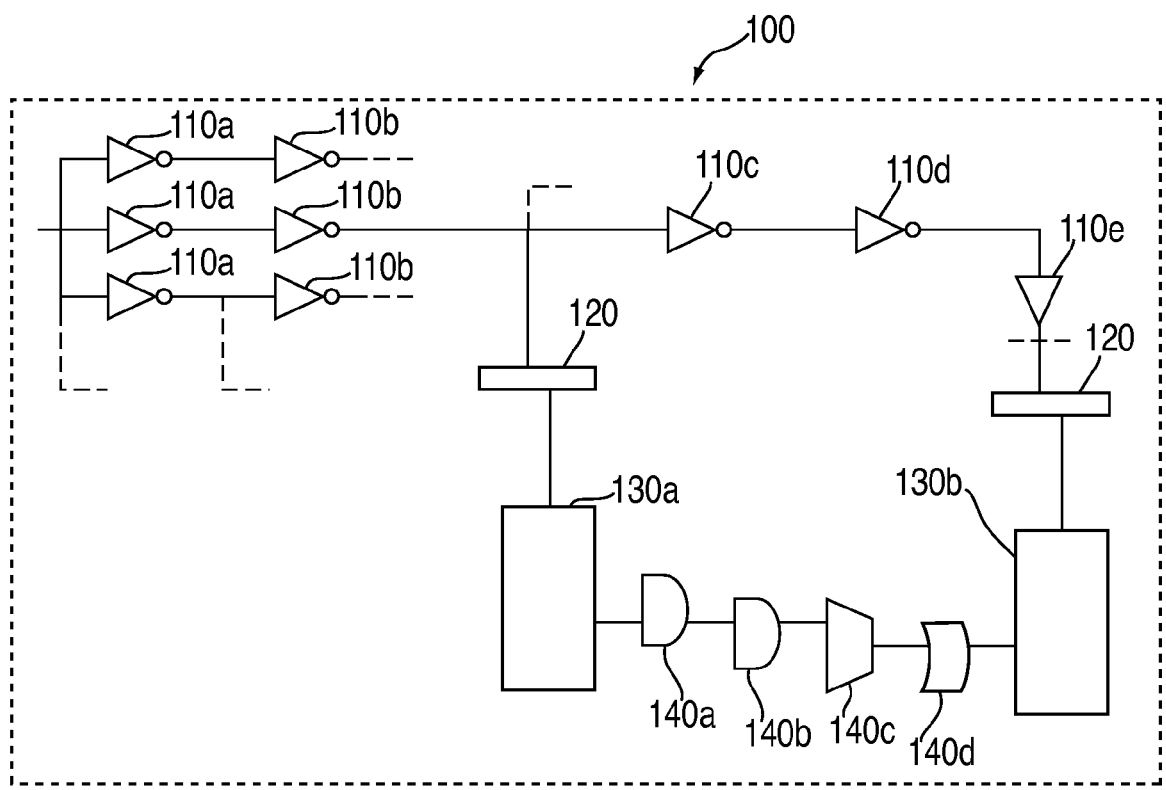
FIG. 1 illustrates an exemplary logical design including clock trees that may be timed according to exemplary embodiments.

According to exemplary embodiments, a larger view of the run-time problem is taken into account than just the timing tool. The physical design and timing closure sequence used on most Application Specific Integrated Circuits (ASICs) are taken advantage of in order to reduce run-time during timing runs. With modest updates to the timing tool and timing methodology, run-time may be greatly reduced for the majority of timing runs.

According to exemplary embodiments, repetition of timing is reduced, not only from within a single timing run, but also from one timing run to the next. In one embodiment, repetition is reduced on the most time-consuming element of timing analysis, the clock tree analysis. It should be noted that while the description that follows focuses on repetition reduction of clock tree analysis, repetition reduction is not necessarily limited to just clock trees but may be applicable to any element of logic for which the technique described herein may be appropriate.

A unique feature of a clock tree is that it becomes stable early in the final timing closure cycle of physical design, and it is generally non-reconvergent. According to an exemplary embodiment, stable portions of logic, like the clock trees, are identified, either manually or automatically, and then a unique, "in context snapshot" is taken of its timing sensitivities for re-use. Unlike using a timing model for a "core" in a hierarchical timing run, the technique described herein is performed in context, independent of hierarchy, and its primary focus is the clocks. Also, the information saved and the mechanism to save it are both different from core processing. In addition, what is actually stored and retrieved, i.e., parameter sensitivities, and the fact that the sensitivities can be used from one timing instance to the next are different from what is used in conventional timing techniques.

According to exemplary embodiments, timing sensitivities (i.e., amounts of variation) of a select set of timing and electrical quantities (quantities such as resistance, arrival times, required arrival times, statistical arrival times, statistical required arrival times, delays, slews, slacks, statistical delays, statistical slews, statistical slacks, loads, pin capacitance, etc.) to each of various sources of variability (such as N/P device mistrack, product aging, metal layer mistrack, voltage threshold mistrack, etc.) are saved. Sensitivities may be due, e.g., to process factors, environmental conditions, modeling uncertainty, electrical noise, transistor degradation, etc. These saved sensitivities are used throughout a timing analysis and in subsequent variation/statistical timing analysis for which the previously selected portion of the logical design is unchanged. This may be practiced in a wide range of applications, including but not limited to common path pessimism removal (CPPR) (e.g., storing sensitivity values for selected portions of logic, such as a clock tree, which is not expected to change during subsequent optimization/fixup steps), block-based statistical timing, and perhaps even for applications such as noise analysis and improved hierarchical/core processing.

The most time consuming process in state-of the art ASIC static timing analysis involves calculating early and late arrival times (via adding parameter tracking credits or subtracting parameter mistracking penalties) among various endpoints in the clock distribution trees. Referring to FIG. 1 for illustrative purposes, a configuration of an exemplary logical design 100 including clock trees is shown that may be timed according to exemplary embodiments. Components 110a, 110b, 110c, 110d, and 110e represent portions of a clock tree. Components 120 represent clock splitters. Components 130a and 130b represent latches with data path logic 140a, 140b, 140c, and 140d depicted there between. In FIG. 1, if all clock wires are routed on the same metal layer, thus making them insensitive to variation from one metal layer to another, the sink latch receives a slack credit for metal. Accurately calculating the arrival times and calculating parameter related adjustments typically require modeling the effects of many different parameters. Parameter examples include N/P transistor device mistrack, silicon and metal aging affects, metal layer deltas, voltage threshold differences, etc. What's more, in conventional timing configurations, these calculations are repeated, not only multiple times during a given timing run, but also each time a new timing run is processed. According to an exemplary embodiment, the redundant clock tree recalculation is removed not only within a timing run, but also from one timing run to another.

Frequently in ASIC physical design, clock trees are placed, wired, shielded and isolated early in the back-end timing closure process. This means that clocks are somewhat stable and available for analysis early in the timing closure process. The clock nets (if isolated and/or shielded) are also, for the most part, immune from coupled noise effects. Thus, according to exemplary embodiments, the timing tool need only fully analyze portions (as required by the design, i.e., in context) of a completed clock tree once, or just occasionally, and save these results for re-use in subsequent timing analysis. This subsequent timing analysis, whether or not in the same timing run, draws on previously saved results, rather than reanalyzing the same clock trees over and over.

Figure 2:
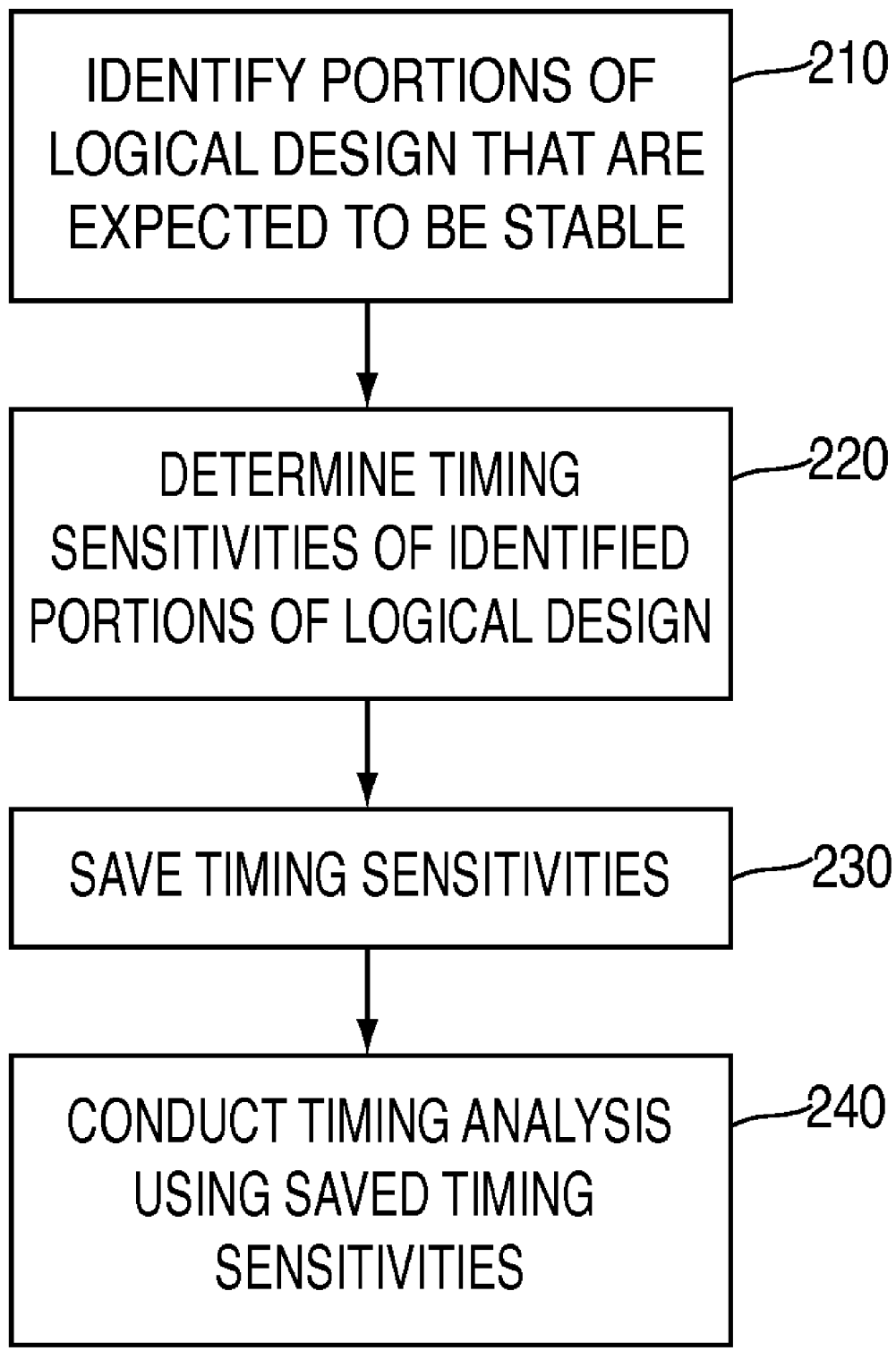
FIG. 2 is a flowchart showing steps involved in timing a logical design according to exemplary embodiments.

FIG. 2 is a flowchart showing steps involved in a method for timing performance of a logical design, such as an ASIC, according to exemplary embodiments. The method begins at step 210 at which at least one portion of the logical design that is expected to act stable with respect to timing performance is identified. At step 220, timing sensitivities of identified portion of the logical design logic are determined. At step 230, the timing sensitivities are saved. At step 240, a timing analysis is conducted, using the saved timing sensitivities for the portion of logical design that was identified as expected to act stable, rather than reexecuting timing for that portion of the logical design. The timing analysis may include static timing analysis, transistor level timing analysis, statistical timing analysis, and any combination thereof. The saved sensitivities may be used in subsequent timing runs, as represented by the arrow returning to step 240. This re-use of timing sensitivities reduces run-time and thereby enhances timing run performance.

Figure 3:
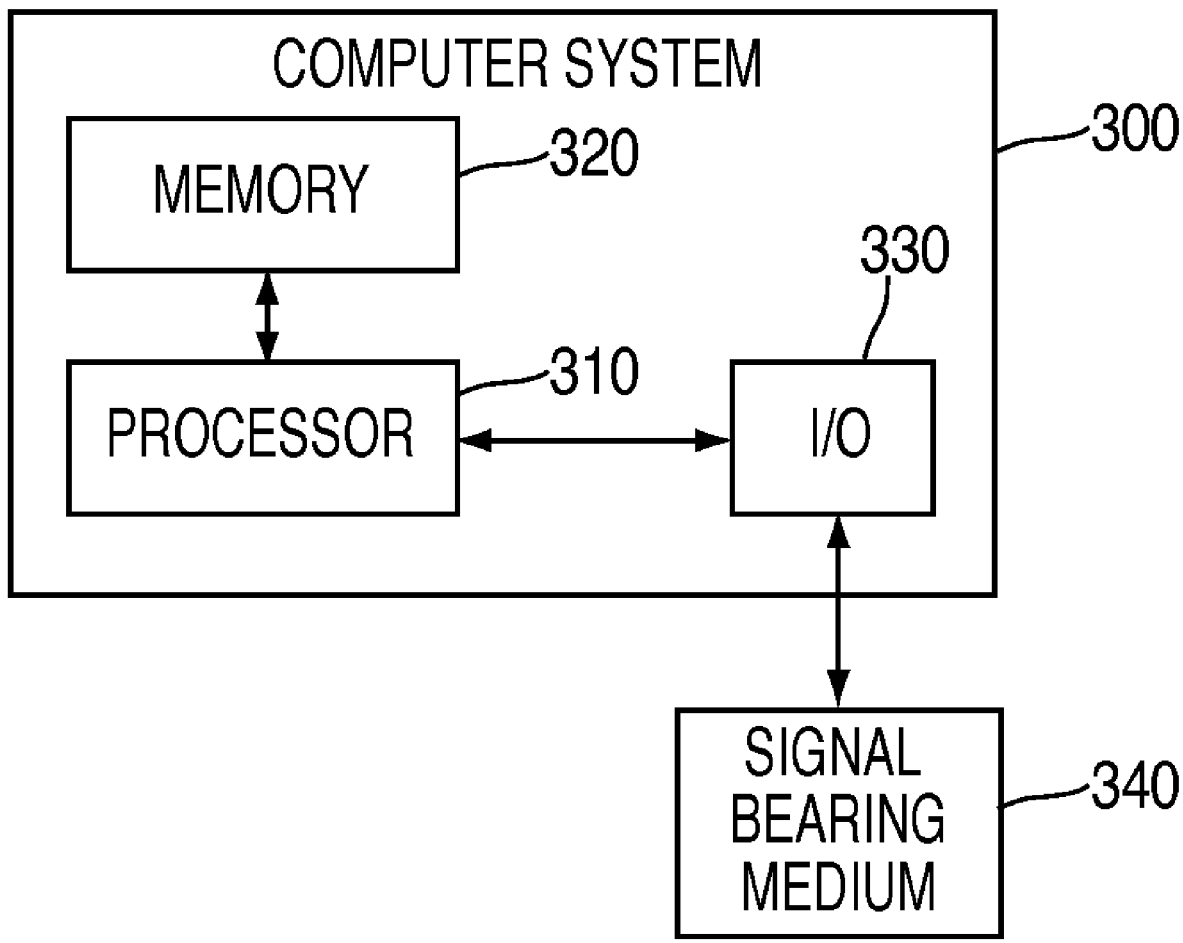
FIG. 3 illustrates an exemplary system for timing a logical design according to exemplary embodiments.

FIG. 3 illustrates an exemplary system for timing according to exemplary embodiments. The system includes a computer 300 in contact with a signal bearing medium 340 via an input/output interface 330. The signal bearing medium 340 may include a representation of a logical design to be timed and may be implemented as, e.g., information permanently stored on non-writable storage media (e.g., read-only memory devices within a computer, such as CD-ROM disks readable by a CD-ROM drive), alterable information stored on a writeable storage media (e.g., floppy disks within a diskette drive or hard-disk drive), information conveyed to a computer by a communications medium, such as through a computer or telephone network, including wireless and broadband communications networks, such as the Internet, etc.

The computer includes a processor 310 that analyzes the logical design represented, e.g., on the signal bearing medium 340 and communicated to the computer via the input/output interface 330 and saves timing sensitivities as appropriate into the memory 320. The logical design may also be saved into memory 320, e.g., via communication with the I/O interface 330 and the signal bearing medium 340. The processor 310 analyzes the logical design to identify one or more portions of the logical design expected to act stable with respect to timing, determines timing sensitivities for those identified portions of logic, and then saves those timing sensitivities into memory 330. The processor 310 then conducts timing runs using the saved timing sensitivities to avoid reexecution of timing on portions of logic that were identified as expected to be stable. The process for timing logic performance may be embodied as a program within the memory 320 or on a signal bearing medium, such as the medium 340, and executed by the processor 310. Although the description above has focused on timing ASIC designs, those skilled in the art will appreciate that it may also be possible to time the performance of an actual ASIC, according to exemplary embodiments.

As described above, since clock trees do not have reconvergence, this allows a timing tool to store segments or pin specific information, rather than path specific information (which would be required on data paths). This allows for an efficient format of, and access to, stored timing information. Examples of how such information may be stored, according to exemplary embodiments, are provided below.

According to one embodiment, within a single timing run, the concept of stored timing data for a given point in the clock tree can be leveraged by a common-path pessimism removal (CPPR) algorithm, including but not limited to the IBM EinsTimer™ CPPR algorithm. The CPPR algorithm identifies common points in the clock tree. Because source and sink points of multiple data paths can share the same common point in a clock tree, the analysis results of that clock point can be saved (perhaps cached) and re-used.

According to another embodiment, from one timing run to the next, a checkpoint capability may be leveraged with some enhancements. According to one embodiment, the capability of the current checkpoints may be modified to allow saving clock analysis information, perhaps as a separate file. This file (containing the clock analysis) may be called by subsequent timing runs on a similar model. Note that the netlist model used to gather the clock information and the models for subsequent analysis do not have to be identical. Suppose the design had undergone a functional change that resulted in a new clock source/sink combination (not previously analyzed). In this situation, the timing tool may fully analyze only the components of the clock tree required for the new data paths and rely on the same clock file for all the rest of the existing paths. In other words, the timing analysis handles design changes in an incremental fashion.

As to generalization, the concept of storage and retrieval of sensitivities may potentially branch to the extreme application of an entire chip or other encompassed model with the expectation that sensitivities for any portion of the logic (not just clocks) which has not changed can be re-used from one timing run to the next.

According to exemplary embodiment, by making changes to both the timing closure process and the timing tool, much savings can be realized in chip design schedules and the utilization of IT Resources.

As described above, exemplary embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc., do not denote any order or importance, but rather the terms first, second, etc., are used to distinguish one element from another.

Further, while the invention was described with respect to a simple illustrative example, it is to be understood that one of ordinary skill in the art can extend and apply this invention in many ways. In the illustrative example, for purposes of clarity, rising and falling timing quantities were not differentiated, but one or ordinary skill in the art could easily apply the invention to a situation with different rising and falling delays, slews, ATs and RATs. One of ordinary skill in the art could also apply the invention to any type of static timing, including, but not limited to, static timing of gate-level circuits, transistor-level circuits, hierarchical circuits, circuits with combinational logic, circuits with sequential logic, timing in the presence of coupling noise, timing in the presence of multiple-input switching, timing in the presence of arbitrary timing tests such as setup, hold, end-of-cycle, pulse width, clock gating and loop-cut tests, and timing in the presence of multiple clock domains.

What is claimed is:

1. A computer implemented method for timing performance of a logical design, comprising:
   identifying using a computer at least one portion of the logical design that is expected to be stable with respect to timing performance;
   determining timing sensitivities of the identified portion of the logical design at a given instant;
   saving the timing sensitivities of the identified portion of the logical design for re-use in a timing analysis; and
   conducting the timing analysis of the logical design, wherein the timing sensitivities of the identified portion of the logical design are re-used throughout the timing analysis and in subsequent timing analyses.

2. The method of claim 1, wherein the logical design is of a digital integrated circuit.

3. The method of claim 1, wherein the timing analysis includes at least one of static timing analysis, transistor level timing analysis, statistical timing analysis, and any combination thereof.

4. The method of claim 1, wherein the step of identifying at least one portion of the logical design that is expected to be stable includes identifying a clock tree.

5. The method of claim 1, wherein the timing sensitivities include sensitivities to sources of variability.

6. The method of claim 1, wherein the timing sensitivities include at least one of: arrival times, required arrival times, delays, slews, slacks, statistical arrival times, statistical required arrival times, statistical delays, statistical slews, statistical slacks, loads, pin capacitances, and any combination thereof.

7. The method of claim 1, wherein the timing sensitivities are due to at least one of: process factors, environmental conditions, modeling uncertainty, electrical noise, transistor degradation, and any combination thereof.

8. A computer program product for timing performance of a logical design, comprising a computer usable medium having a computer readable program, wherein the computer readable program, when executed on a computer, causes the computer to:
   identify at least one portion of the logical design that is expected to be stable with respect to timing performance;
   determine timing sensitivities of the identified portion of the logical design at a given instant;
   save the timing sensitivities of the identified portion of the logical design for re-use in a timing analysis; and
   conduct the timing analysis on the logical design, wherein the timing sensitivities of the identified portion of the logical design are re-used throughout the timing analysis and in subsequent timing analyses.

9. The computer program product of claim 8, wherein the logical design is of a digital integrated circuit.

10. The computer program product of claim 8, wherein the timing analysis includes at least one of: static timing analysis, transistor level timing analysis, statistical timing analysis, and any combination thereof.

11. The computer program product of claim 8, wherein the computer readable program causes the computer to identify a clock tree as a portion of the logical design that is expected to be stable with respect to timing performance.

12. The computer program product of claim 8, wherein the timing sensitivities include sensitivities to sources of variability.

13. The computer program product of claim 8, wherein the timing sensitivities include at least one of: of arrival times, required arrival times, delays, slews, slacks, statistical arrival times, statistical required arrival times, statistical delays, statistical slews, statistical slacks, loads, pin capacitances, and any combination thereof.

14. The computer program product of claim 8, wherein the timing sensitivities are due to at least one of process factors, environmental conditions, modeling uncertainty, electrical noise, transistor degradation, and any combination thereof.

15. An apparatus for timing performance of a logical design, comprising:
   a processor for identifying at least one portion of the logical design that is expected to be stable with respect to timing performance and determining timing sensitivities of the identified portion of the logical design at a given instant; and
   a memory for storing the timing sensitivities of the identified portion of the logical design for re-use in a timing analysis, wherein the processor conducts the timing analysis of the logical design, and the timing sensitivities of the identified portion of the logical design are re-used throughout the timing analysis and in subsequent timing analyses.

16. The apparatus of claim 15, wherein the logical design is of a digital integrated circuit.

17. The apparatus of claim 15, wherein the timing analysis includes at least one of: static timing analysis, transistor level timing analysis, statistical timing analysis, and any combination thereof.

18. The apparatus of claim 15, wherein the processor identifies a clock tree as a portion of the logical design that is expected to be stable.

19. The apparatus of claim 15, wherein the timing sensitivities include sensitivities to sources of variability.

20. The apparatus of claim 15, wherein the timing sensitivities include at least one of: of arrival times, required arrival times, delays, slews, slacks, statistical arrival times, statistical required arrival times, statistical delays, statistical slews, statistical slacks, loads, pin capacitances, and any combination thereof, and the timing sensitivities are due to at least one of process factors, environmental conditions, modeling uncertainty, electrical noise, transistor degradation, and any combination thereof.

* * * * *